(12) United States Patent
Moriwaki et al.

(10) Patent No.: US 11,145,835 B2
(45) Date of Patent: *Oct. 12, 2021

(54) IMAGING DEVICE HAVING A PHOTOELECTRIC CONVERSION LAYER

(71) Applicant: Sony Corporation, Tokyo (JP)

(72) Inventors: Toshiki Moriwaki, Kanagawa (JP); Toru Udaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 41 days.

This patent is subject to a terminal disclaimer.

(21) Appl. No.: 16/255,090

(22) Filed: Jan. 23, 2019

(65) Prior Publication Data

US 2019/0172956 A1   Jun. 6, 2019

Related U.S. Application Data

(63) Continuation of application No. 14/249,054, filed on Apr. 9, 2014, now Pat. No. 10,236,396.

(30) Foreign Application Priority Data

Apr. 10, 2013  (JP) ................................. 2013-081990
Mar. 6, 2014   (JP) ................................. 2014-043640

(51) Int. Cl.
*H01L 51/44*    (2006.01)
*H01L 27/146*   (2006.01)
(Continued)

(52) U.S. Cl.
CPC ...... *H01L 51/442* (2013.01); *H01L 27/14665* (2013.01); *H01L 31/0224* (2013.01);
(Continued)

(58) Field of Classification Search
CPC ..... H01L 31/0224; H01L 31/022466–022486; H01L 31/035209; H01L 2924/0134; H01L 51/441; H01L 51/442
See application file for complete search history.

(56) References Cited

U.S. PATENT DOCUMENTS

2011/0233555 A1* 9/2011 Endo ................. H01L 29/41733
                                                          257/60
2013/0270600 A1  10/2013 Helander et al.
(Continued)

FOREIGN PATENT DOCUMENTS

JP  2007-067194 A   3/2007
KR  2012-0105682 A  9/2012

OTHER PUBLICATIONS

Machine translation KR 10-2012-0105682 to Industry Foundation of Chonnam National University (Year: 2012).*
(Continued)

*Primary Examiner* — Laura M Menz
*Assistant Examiner* — Candice Chan
(74) *Attorney, Agent, or Firm* — K&L Gates LLP

(57) ABSTRACT

An imaging device is provided. The imaging device includes a semiconductor substrate; a first electrode disposed above the semiconductor substrate; a second electrode disposed above the first electrode; and a photoelectric conversion layer disposed between the first electrode and the second electrode, wherein a difference between a work function value of the first electrode and a work function value of the second electrode is 0.4 eV or more, and wherein the first electrode has a sheet resistance value of $3\times10$ $\Omega/\square$ to $1\times10^3 \Omega/\square$.

14 Claims, 6 Drawing Sheets

(51) Int. Cl.
*H01L 31/0224* (2006.01)
*H01L 31/0352* (2006.01)
*H01L 27/30* (2006.01)

(52) U.S. Cl.
CPC .... *H01L 31/035209* (2013.01); *H01L 51/441* (2013.01); *H01L 27/307* (2013.01); *H01L 31/022466* (2013.01); *H01L 31/022475* (2013.01); *H01L 2924/0134* (2013.01)

(56) References Cited

U.S. PATENT DOCUMENTS

| | | |
|---|---|---|
| 2014/0084283 A1 | 3/2014 | Lim et al. |
| 2015/0060839 A1* | 3/2015 | Suzuki ............... H01L 51/4273 257/40 |

OTHER PUBLICATIONS

Machine translation JP 2007-067194 to Fujifilm Corp. (Year: 2007).*

* cited by examiner

IMAGING DEVICE HAVING A PHOTOELECTRIC CONVERSION LAYER

CROSS REFERENCES TO RELATED APPLICATIONS

The present application is a continuation of U.S. application Ser. No. 14/249,054, filed Apr. 9, 2014, which claims priority to Japanese Priority Patent Application JP 2013-081990 filed in the Japan Patent Office on Apr. 10, 2013, and Japanese Priority Patent Application JP 2014-043640 filed in the Japan Patent Office on Mar. 6, 2014, the entire content of which is hereby incorporated by reference.

BACKGROUND

The present disclosure relates to an electronic device, a solid state imaging apparatus to which the electronic device is mounted, and a method of producing an electrode for the electronic device.

In general, an electronic device including a photoelectric conversion element such as an image sensor has a structure that a photoelectric conversion site is sandwiched between two electrodes. Such a photoelectric conversion element is well-known from Japanese Patent Application Laid-open No. 2007-067194. An organic photoelectric conversion element disclosed in Japanese Patent Application Laid-open No. 2007-067194 is configured of a lower electrode, an organic layer and an upper electrode laminated in this order. At least one of the lower and upper electrodes is a transparent electrode. One of the electrodes collects electrons, and the other electrode collects holes to read out a photocurrent. The one electrode collecting electrons is the transparent electrode, and has a work function of 4.5 eV or less. On the other hand, the other electrode collecting holes has the work function of 4.5 eV or more.

SUMMARY

Japanese Patent Application Laid-open No. 2007-067194 specifies a work function value of the one electrode collecting electrons and a work function value of the other electrode collecting holes. However, there is no description about a difference between the work function value of the one electrode collecting electrons and the work function value of the other electrode collecting holes. Also, there is no description about optimization of the work function of the electrode collecting electrons. Further, there is no description about an internal electric field generated in the organic layer from the standpoint of an internal quantum efficiency improvement.

It is desirable to provide an electronic device having a configuration that a difference between work function values of two electrodes can be optimized and the internal quantum efficiency can be improved, a solid state imaging apparatus to which the electronic device is mounted, and a method of producing an electrode for the electronic device. In addition, it is also desirable to provide an electronic device having a configuration that the work function of the electrode collecting electrons can be optimized, a solid state imaging apparatus to which the electronic device is mounted, and a method of producing an electrode for the electronic device.

According to a first embodiment of the present disclosure, there is provided an electronic device including a first electrode, a second electrode and a photoelectric conversion layer sandwiched between the first electrode and the second electrode.

The first electrode includes an amorphous oxide composed of at least a quaternary compound of indium (In), gallium (Ga) and/or aluminum (Al), zinc (Zn) and oxygen (O).

According to a second embodiment of the present disclosure, there is provided an electronic device including a first electrode, a second electrode and a photoelectric conversion layer sandwiched between the first electrode and the second electrode.

The first electrode includes an amorphous oxide composed of at least a quaternary compound of indium (In), gallium (Ga) and/or aluminum (Al), zinc (Zn) and oxygen (O).

The first electrode has a laminated structure including a first B layer and a first A layer from a photoelectric conversion layer side.

A work function value of the first A layer of the first electrode is lower than a work function of the first B layer of the first electrode.

According to a first or second embodiment of the present disclosure, there is provided a solid state imaging apparatus to which the above-described first or second electronic device is mounted.

According to a first embodiment of the present disclosure, there is provided a method of producing an electrode for the electronic device including a first electrode, a second electrode and a photoelectric conversion layer sandwiched between the first electrode and the second electrode.

The first electrode includes an amorphous oxide composed of at least a quaternary compound of indium (In), gallium (Ga) and/or aluminum (Al), zinc (Zn) and oxygen (O).

A difference between a work function value of the second electrode and a work function value of the first electrode is 0.4 eV or more.

An oxygen gas introduction amount (an oxygen gas partial pressure) is controlled when the first electrode is formed by a sputtering method to control the work function value of the first electrode.

According to a second embodiment of the present disclosure, there is provided a method of producing an electrode for the electronic device including a first electrode, a second electrode and a photoelectric conversion layer sandwiched between the first electrode and the second electrode.

The first electrode includes an amorphous oxide composed of at least a quaternary compound of indium (In), gallium (Ga) and/or aluminum (Al), zinc (Zn) and oxygen (O).

The first electrode has a laminated structure including a first B layer and a first A layer from a photoelectric conversion layer side.

A work function value of the first A layer of the first electrode is lower than a work function of the first B layer of the first electrode.

An oxygen gas introduction amount (an oxygen gas partial pressure) is controlled when the first electrode is formed by a sputtering method to control the work function values of the first A layer and the first B layer of the first electrode.

In the electronic device or the solid state imaging apparatus according to a first embodiment of the present disclosure, the difference between the work function value of the second electrode and the work function value of the first electrode is specified. When a bias voltage is applied between the first electrode and the second electrode, the internal quantum efficiency can be improved, and a dark current can be suppressed. In the electronic device or the solid state imaging apparatus according to a second embodiment of the present disclosure, the first electrode has a bilayer of the first A layer and the first B layer, and a difference between the work function value of the first B layer and the work function value of the first A layer is specified. Therefore, the work function of the first electrode can be optimized, thereby exchanging (migrating) carriers more easily.

In the method of producing an electrode for the electronic device according to a first embodiment of the present disclosure, the oxygen gas introduction amount (the oxygen gas partial pressure) is controlled when the first electrode is formed by a sputtering method to control the work function value of the first electrode. As a result, a large internal electric field can be generated in the photoelectric conversion layer based on the difference between the work function values, thereby improving the internal quantum efficiency. In addition, an electronic device being capable of suppressing a dark current can be generated simply. In the method of producing an electrode for the electronic device according to a second embodiment of the present disclosure, the oxygen gas introduction amount (the oxygen gas partial pressure) is controlled when the first electrode is formed by a sputtering method to control the work function values of the first 1A layer and the first B layer of the first electrode. As a result, the work function of the first electrode can be optimized.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

DETAILED DESCRIPTION

Figure 1A:
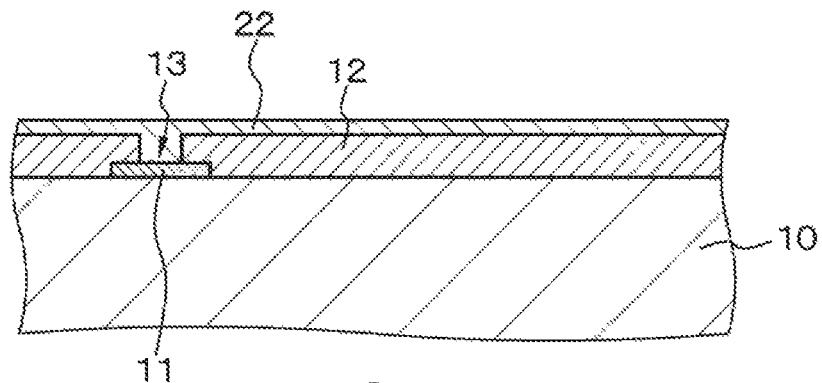
FIGS. 1A and 1B each is a schematic partial sectional view of a substrate for illustrating a method of producing an electronic device according to a first embodiment and a method of producing an electrode for the electronic device according to the first embodiment.

Hereinafter, an embodiment of the present disclosure will be described with reference to the drawings. It should be noted that the present invention is not limited to the embodiments described below. The numerals and materials cited in Embodiments are only illustrative. The embodiments of the present disclosure will be described in the following order.

1. Electronic Device, Solid State Imaging Apparatus, and Method of Producing Electrode for Electronic Device according to First or Second Embodiment of Present Disclosure, General Description
2. First Embodiment (Electronic Device and Method of Producing Electrode for Electronic Device according to First Embodiment of Present Disclosure)
3. Second Embodiment (Electronic Device and Method of Producing Electrode for Electronic Device according to Second Embodiment of Present Disclosure)
4. Third Embodiment (Solid State Imaging Apparatus according to First or Second Embodiment of Present Disclosure), Others

[Electronic Device, Solid State Imaging Apparatus, and Method of Producing Electrode for Electronic Device according to First or Second Embodiment of Present Disclosure, General Description]

An electronic device according to a first embodiment of the present disclosure, an electronic device configuring the solid state imaging apparatus according to a first embodiment of the present disclosure, and an electronic device provided by the method of producing the electrode for the electronic device according to a first embodiment of the present disclosure may be hereinafter referred collectively to as "electronic devices according to a first embodiment of the present disclosure"). An electronic device according to a second embodiment of the present disclosure, an electronic device configuring the solid state imaging apparatus according to a second embodiment of the present disclosure, and an electronic device provided by the method of producing the electrode for the electronic device according to a second embodiment of the present disclosure may be hereinafter referred collectively to as "electronic devices according to a second embodiment of the present disclosure"). A method of producing an electrode for the electronic device according to a first embodiment of the present disclosure and a method of producing an electrode for the electronic device according to a second embodiment of the present disclosure may be hereinafter referred collectively to as "methods of producing the electrodes in the electronic devices according to the present disclosure").

In the electronic devices according to a first embodiment of the present disclosure or in the method of producing an electrode for the electronic device according to a first embodiment of the present disclosure, a difference between a work function value of the second electrode and a work function value of the first electrode being 0.4 eV or more, thereby, based on the difference between the work function values, generating an internal electric field in the photoelectric conversion layer to improve an internal quantum efficiency.

In the electronic devices according to a second embodiment of the present disclosure or in the method of producing an electrode for the electronic device according to a second embodiment of the present disclosure, a difference between the work function value of the first A layer of the first electrode and the work function of the first B layer of the first electrode is desirably 0.1 eV to 0.2 eV, and a difference between a work function value of the second electrode and a work function value of the first electrode being 0.4 eV or more.

In the electronic devices according to the second embodiment of the present disclosure or in the method of producing an electrode for the electronic device according to the second embodiment of the present disclosure, the first electrode has a thickness of $1 \times 10^{-8}$ m to $1 \times 10^{-7}$ m. A ratio between the thickness of the first A layer of the first electrode and the thickness of the first B layer of the first electrode can be 9/1 to 1/9. In order to diminish effects of oxygen atoms or oxygen molecules on the photoelectric conversion layer, the first B layer of the first electrode is more desirably thinner than the first A layer of the first electrode. In the electronic devices according to the first embodiment of the present disclosure including the above-described embodiments or in the method of producing an electrode for the electronic device according to the first embodiment of the present disclosure, the first electrode has a thickness of $1 \times 10^{-8}$ m to $1 \times 10^{-7}$ m.

In the electronic devices according to the second embodiment of the present disclosure including the above-described embodiments or in the method of producing an electrode for the electronic device according to the second embodiment of the present disclosure, a difference between a work function value of the second electrode and a work function value of the first A layer of the first electrode being 0.4 eV or more, thereby, based on the difference between the work function values, generating an internal electric field in the photoelectric conversion layer to desirably improve an internal quantum efficiency.

In the electronic devices according to the first to the second embodiments of the present disclosure including a variety of the above-described embodiments and the methods of producing the electrodes in the electronic devices according to the present disclosure, the work function value of the first electrode is not limited, but can be 4.1 eV to 4.5 eV, for example.

In the electronic devices according to the first to the second embodiments of the present disclosure including a variety of the above-described embodiments and the methods of producing the electrodes in the electronic devices according to the present disclosure, the first electrode is composed of a transparent conductive material such as indium gallium complex oxide (IGO), indium-doped gallium zinc complex oxide (IGZO, In—GaZnO4), aluminum oxide-doped zinc oxide (AZO), indium zinc complex oxide (IZO) and gallium-doped zinc oxide (GZO). The first electrode composed of the transparent conductive material has the work function value of 4.1 eV to 4.5 eV, for example. In the electronic devices according to the first to the second embodiments of the present disclosure or in the methods of producing the electrodes in the electronic devices according to the present disclosure, the second electrode is composed of indium tin complex oxide (ITO), indium zinc complex oxide (IZO) and tin oxide (SnO2). The second electrode composed of the transparent conductive material has the work function value of 4.8 eV to 5.0 eV, for example.

In the electronic devices according to the first to the second embodiments of the present disclosure or in the methods of producing the electrodes in the electronic devices according to the present disclosure, the first electrode has desirably light transmittance of 80% or more at wavelengths of 400 nm to 660 nm. Also, the second electrode has desirably light transmittance of 80% or more at wavelengths of 400 nm to 660 nm. Furthermore, in the electronic devices according to the first to the second embodiments of the present disclosure or in the methods of producing the electrodes in the electronic devices according to the present disclosure including the above-described embodiments and configurations, the first electrode has desirably a sheet resistance value of $3 \times 10 \Omega$/square to $1 \times 10^3 \Omega$/square.

In the electronic devices according to the first to the second embodiments of the present disclosure including the above-described embodiments and configurations, the oxygen gas introduction amount (the oxygen gas partial pressure) is controlled when the first electrode is formed by a sputtering method, thereby controlling the work function value of the first electrode. Also, the oxygen gas introduction amount (the oxygen gas partial pressure) is controlled when the first electrode is formed by a sputtering method, thereby controlling the work function values of the first A layer and the first B layer of the first electrode. Moreover, in the electronic devices according to the first to the second embodiments of the present disclosure including the above-described embodiments and configurations, an oxygen content rate of the first electrode is less than an oxygen content rate of a stoichiometric composition. Based on the oxygen content rate, the work function value of the first electrode can be controlled. The lower the oxygen content rate of the first electrode than the oxygen content rate of the stoichiometric composition is, i.e., the higher oxygen defects are, the lower the work function value is. The oxygen content of the first A layer of the first electrode is lower than that of the first B layer of the first electrode.

In the electronic devices according to the first to the second embodiments of the present disclosure including the above-described embodiments and configurations, the electronic device is a photoelectric conversion element. In the methods of producing the electrodes in the electronic devices according to the present disclosure, the electrode can be used for the photoelectric conversion element.

In the methods of producing the electrodes in the electronic devices according to the present disclosure including a variety of the embodiments, an oxygen content rate of the first electrode is less than an oxygen content rate of a stoichiometric composition. In the method of producing the electrode for the electronic device according to the second embodiment of the present disclosure, the oxygen content of the first A layer of the first electrode is lower than that of the first B layer of the first electrode.

In the electronic devices according to the first to the second embodiments of the present disclosure (hereinafter may be referred collectively to as "electronic devices according to the present disclosure) including the above-described embodiments and configurations, the first electrode is formed on the substrate, the photoelectric conversion layer is formed on the first electrode, and the second electrode is formed on the photoelectric conversion layer, or the second electrode is formed on the substrate, the photoelectric conversion layer is formed on the second electrode, and the first electrode is formed on the photoelectric conversion layer. In other words, the present electronic devices have a two-terminal electronic device structure including the first electrode and the second electrode. However, the present electronic devices are not limited thereto, and may have a three-terminal electronic device structure further including a control electrode. When a voltage is applied to the control electrode, a flowing current can be modulated. Examples of the three-terminal electronic device structure include the same structure or configuration as a so-called bottom gate/bottom contact type, bottom gate/top contact type, top gate/bottom contact type, or top gate/top contact type field effect transistor (FET). The first electrode can function as a cathode (negative) electrode (in other words, an electrode for taking out electrons), and the second electrode can function as an anode (positive) electrode (in other words, an electrode for taking out holes). A plurality of electronic devices including the photoelectric conversion layers having different light absorption spectra may be laminated. For example, the substrate may be a silicon semiconductor substrate. On the silicon semiconductor substrate, a driving circuit and a photoelectric conversion layer for the electronic device may be disposed. The electronic devices may be laminated on the silicon semiconductor substrate.

The photoelectric conversion layer may be amorphous or crystal. As an organic material of the photoelectric conversion layer, an organic semiconductor material, an organic metal compound, an organic semiconductor microparticle, a metal oxide semiconductor, an inorganic semiconductor microparticle, a material including a core member covered with a shell member, and an organic-inorganic hybrid compound can be used.

Examples of the organic semiconductor material include an organic dye such as quinacridone and a derivative thereof, a dye where a preceding cycle (metal left side periodic table) ion is chelated with an organic material such as Alq3 [tris(8-quinolinolato)aluminum (III)], an organic metal dye complex formed by a transition metal ion and an organic material such as phthalocyanine zinc (II), dinaphthothienothiophene (DNTT) and the like.

As the organic metal compound, the dye where the preceding cycle ion is chelated with the organic material or the organic metal dye complex formed by the transition metal ion and the organic material can be used. Examples of the organic semiconductor microparticle include an organic dye aggregate such as the above-described quinacridone and the derivative thereof, a dye aggregate where the preceding cycle ion is chelated with the organic material, an organic metal dye aggregate complex formed by the transition metal ion and the organic material, Prussian blue where a metal ion is cross-linked with cyano groups or a complex aggregate thereof.

Examples of the metal oxide semiconductor and the inorganic semiconductor microparticle include ITO, IGZO, ZnO, IZO, IrO2, TiO2, SnO2, SiOx, a metal chalcogen semiconductor containing chalcogen [for example, sulfur (S), selenium (Se), tellurium (Te)] (specifically, CdS, CdSe, ZnS, CdSe/CdS, CdSe/ZnS, PbSe), ZnO, CdTe, GaAs and Si.

Examples of the material including the core member covered with the shell member, i.e., a combination of the core member and the shell member, include an organic material such as polystyrene and polyaniline and a metal material that is difficult or easy to be ionized. Examples of the organic-inorganic hybrid compound include Prussian blue where a metal ion is cross-linked with cyano groups or a derivative thereof, metal ions endlessly cross-linked with pipyridines, and a coordination polymer that is a collective term of metal ions cross-linked with multivalent ion acid such as oxalic acid and rubeanic acid.

The photoelectric conversion layer is formed by a coating method, a physical vapor deposition (PVD) method or a variety of chemical vapor deposition (CVD) method including a MOCVD method, depending on the material used. Examples of the coating method include a variety of printing methods such as a spin coating method, an immersion method, a cast method, a screen printing method, an inkjet printing method, an offset printing method and a gravure printing method; a stamp method; a spray method; a variety of coating method such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method and a calendar coater method. In the coating method, a non-polar or low polar organic solvent such as toluene, chloroform, hexane and ethanol can be used. Examples of the PVD method include a variety of vacuum vapor deposition methods such as an electron beam heating method, a resistive heating method and a flash vapor deposition; a plasma vapor deposition method; a variety of sputtering methods such as a diode sputtering method, a DC (direct current) sputtering method, a DC magnetron sputtering method, a high frequency sputtering method, a magnetron sputtering method, an ion beam sputtering method and a bias sputtering method; and a variety of ion plating methods such as a DC method, an RF method, a multicathode method, an activation reaction method, an electric field vapor deposition method, a high frequency ion plating method, and a reactive ion plating method.

The photoelectric conversion layer has a non-limiting thickness of $1 \times 10^{-10}$ m to $5 \times 10^{-7}$ m.

The first electrode is formed by the sputtering method. Specifically, the sputtering method includes a magnetron sputtering method, a parallel flat plate sputtering method, and a plasma generation method using DC discharge or RF discharge. According to the present disclosure, the work function can be advantageously controlled by an oxygen flow rate (the oxygen gas introduction amount, the oxygen gas partial pressure).

The second electrode is formed by the PVD method such as a vacuum vapor deposition method, a reactive vapor deposition method, a variety of sputtering methods, an electron beam vapor deposition method and an ion plating method, a pyrosol method, a method of thermally decomposing an organic metal compound, a spray method, a dipping method, a variety of CVD methods including a MOCVD method, a electroless plating method and an electrolytic plating method.

Examples of the material of the substrate include an organic polymer (having a configuration of a polymer material such as a plastic film, a plastic sheet and a plastic substrate having a flexibility composed of the polymeric material) including polymethyl methacrylate (PMMA), polyvinyl alcohol (PVA), polyvinyl phenol (PVP), polyether sulfone (PES), polyimide, polycarbonate (PC), polyethylene terephthalate (PET), polyethylene naphthalate (PEN). When the substrate composed of the flexible polymer material is used, the electronic device can be incorporated into or integrated with the electronic apparatus having a curved shape, for example. Also, examples of the substrate include a variety of glass substrates, a variety of glass substrates each having an insulation film formed on each surface, a quartz substrate, a quartz substrate having an insulation film formed on the surface, a silicon semiconductor substrate, a silicon semiconductor substrate having an insulation film formed on the surface, and a metal substrate composed of an alloy or a metal including stainless steel. Examples of the insulation film include an silicon oxide material (SiOx and spin-on glass(SOG)); silicon nitride (SiNY); silicon oxynitride (SiON); aluminum oxide (Al2O3); a metal oxide and a metal salt. Also, a conductive substrate having the insulation film formed on the surface (a metal substrate including gold, aluminum etc., or a highly oriented graphite substrate) can be used. The surface of the substrate is desirably smooth, but may have roughness as long as the properties of the photoelectric conversion layer are not adversely affected. On the surface of the substrate, a silanol derivative is formed by a silane coupling method, a thin film composed of a thiol derivative, a carboxylic acid derivative, a phosphoric acid derivative etc. is formed by a SAM method, or a thin film composed of an insulated metal salt or metal complex is formed by a CVD method, thereby improving adhesion between the first electrode or the second electrode and the substrate.

In some cases, the first electrode or the second electrode may be coated with a coating layer. Examples of the coating layer include an inorganic insulation material, e.g., a high dielectric insulation film of a metal oxide including a silicon oxide material, silicon nitride (SiNY) and aluminum oxide (Al2O3); an organic insulation material (an organic polymer) such as polymethyl methacrylate (PMMA), polyvinyl phenol (PVP), polyvinyl alcohol (PVA), polyimide, polycarbonate (PC), polyethylene terephthalate (PET), polystyrene, a silanol derivative including N-2(aminoethyl)3-aminopropyl trimethoxysilane (AEAPTMS), 3-mercaptopropyl trimethoxysilane (MPTMS) and octadecyl trichlorosilane (OTS), straight chain hydrocarbons having a functional group being capable of bonding to the control electrode at one end including octadecane thiol and dodecyl isocyanate; and a combination thereof. Examples of the silicon oxide material include silicon oxide (SiOX), BPSG, PSG, BSG, AsSG, PbSG, silicon oxynitride (SiON), SOG (spin-on glass) and a low dielectric material (for example, polyarylether, cycloperfluorocarbon polymer, benzocyclobutene, cyclic fluoro resin, polytetrafluoroethylene, fluorinated arylether, fluorinated polyimide, amorphous carbon and organic SOG). The insulation layer can be formed by a variety of the PVD methods described above, a variety of the CVD methods described above, a spin coat method, a variety of the coating method described above, a sol-gel method, an electrodeposition method, a shadow mask method or a spray method.

The electronic device according to an embodiment of the present disclosure can be used for an optical sensor and an image sensor as well as an imaging apparatus (a solid state imaging apparatus) such as a television camera.

First Embodiment

Figure 1B:
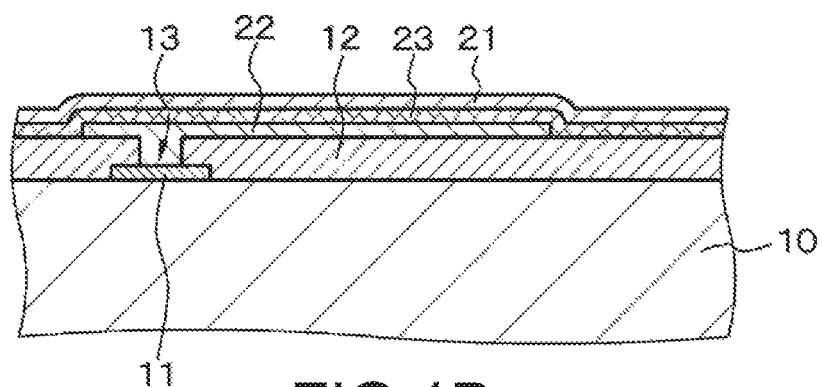

The first embodiment refers to an electronic device according to a first embodiment of the present disclosure and a method of producing an electrode for the electronic device according to a first embodiment of the present disclosure. FIG. 1B shows a schematic partial sectional view of the electronic device.

Specifically, the electronic device according to the first embodiment or the second embodiment described below includes the photoelectric conversion element, and has a first electrode 21, a second electrode 22 and a photoelectric conversion layer 23 sandwiched between the first electrode 21 and the second electrode 22. The first electrode 21 includes an amorphous oxide composed of at least a quaternary compound [Ina(Ga, Al)bZncOd] of indium (In), gallium (Ga) and/or aluminum (Al), zinc (Zn) and oxygen (O). Here, "a", "b", "c" and "d" can have a variety of values. More specifically, in the electronic device according to the first embodiment, the second electrode 22 is formed on a substrate 10 composed of a silicon semiconductor substrate, the photoelectric conversion layer 23 is formed on the second electrode 22, and the first electrode 21 is formed on the photoelectric conversion layer 23. Thus, the electronic device according to the first embodiment or the second embodiment described below has a two-terminal electronic device structure including the first electrode 21 and the second electrode 22. In the electronic device according to the first embodiment or the second embodiment described below a difference between a work function value of the second electrode 22 and a work function value of the first electrode 21 is 0.4 eV or more. By setting the difference between the work function value of the second electrode 22 and the work function value of the first electrode 21 to 0.4 eV or more, based on the difference between the work function values, an internal electric field is generated in the photoelectric conversion layer 23 to improve an internal quantum efficiency. The first electrode 21 can function as a cathode (negative) electrode. In other words, the first electrode 21 can function as an electrode for taking out electrons. On the other hand, the second electrode 22 can function as an anode (positive) electrode. In other words, the second electrode 22 can function as an electrode for taking out holes. The photoelectric conversion layer 23 is composed of quinacridone having a thickness of 100 μm.

More specifically, according to the first embodiment, the first electrode 21 is composed of a transparent conductive material such as indium-doped gallium zinc complex oxide (IGZO). The second electrode 22 is composed of a transparent conductive material such as indium tin complex oxide (ITO). IGZO has the work function value of 4.1 eV to 4.2 eV depending on the film formation conditions. ITO has the work function value of 4.8 eV to 5.0 eV depending on the film formation conditions. Other materials of the first electrode 21 include indium gallium complex oxide (IGO), aluminum oxide-doped zinc oxide (AZO), indium zinc complex oxide (IZO) and gallium-doped zinc oxide (GZO). Other materials of the second electrode 22 include indium zinc complex oxide (IZO) and tin oxide (SnO2). The above-described description is also applicable to the second embodiment as described below.

In the electronic device according to the first embodiment or the second embodiment described below, the first electrode 21 has light transmittance of 80% or more at wavelengths of 400 nm to 660 nm. Also, the second electrode 22 has light transmittance of 80% or more at wavelengths of 400 nm to 660 nm. The light transmittances of the first electrode 21 and the second electrode 22 can be measured by forming the first electrode 21 and the second electrode 22 on a transparent glass plate. The first electrode 21 has a sheet resistance value of 3×10Ω/square to 1×103Ω/square. More specifically, the first electrode 21 composed of IGZO having a thickness of 100 μm has a sheet resistance value of 800Ω/square.

Hereinafter, a method of producing an electrode for the electronic device according to the first embodiment, specifically, a method of producing the first electrode, will be described referring to FIGS. 1A and 1B. The electrode provided by the method of producing the electrode for the electronic device according to the first embodiment is an electrode for a photoelectric conversion element.

Process 100

The substrate 10 composed of a silicon semiconductor substrate is prepared. The substrate 10 includes a driving circuit (not shown) and a photoelectric conversion layer (not shown) for the electronic device, and wiring 11. On the surface of the substrate 10, an insulation layer 12 is formed. The insulation layer 12 has an opening 13 where the wiring 11 is exposed on a bottom. On the insulation layer 12 and within the opening 13, the second electrode 22 composed of ITO is formed (film-formed) by a sputtering method (see FIG. 1A).

Process 110

Next, the second electrode 22 is patterned. Thereafter, on an entire surface, the photoelectric conversion layer 23 composed of quinacridone is formed (film-formed) by a vacuum vapor deposition method. In addition, on the photoelectric conversion layer 23, the first electrode 21 composed of IGZO is formed (film-formed) by a sputtering method. In this way, the electronic device having the structure shown in FIG. 1B according to the first embodiment can be provided.

Figure 2A:
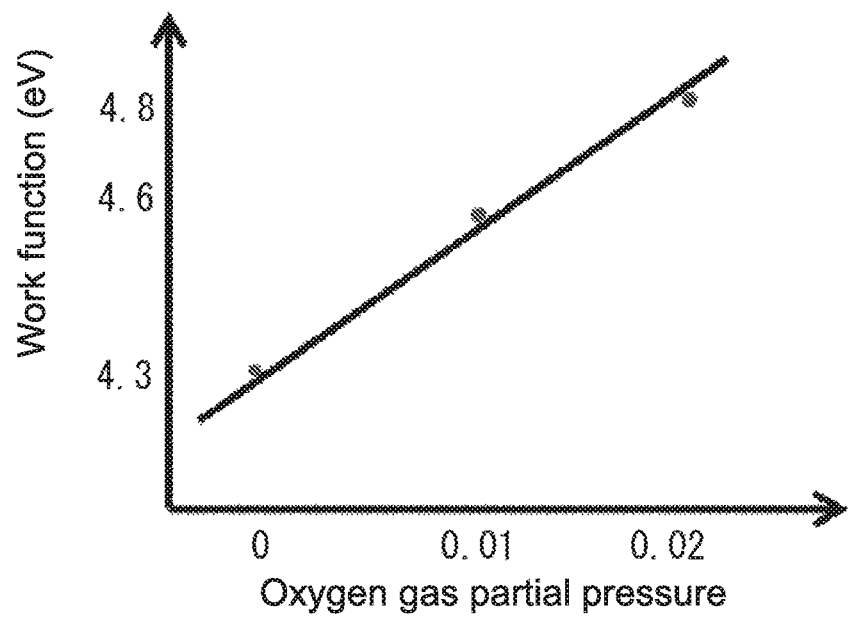
FIG. 2A is a graph showing a relationship between an oxygen gas introduction amount (an oxygen gas partial pressure) when a first electrode is formed by a sputtering method and a work function value of the first electrode.

An oxygen gas introduction amount (an oxygen gas partial pressure) is controlled when the first electrode 21 is formed by a sputtering method to control the work function value of the first electrode 21. FIG. 2A is a graph showing a relationship between the oxygen gas partial pressure and the work function value of the first electrode 21. The higher the value of the oxygen gas partial pressure is, i.e., the lower the oxygen defects are, the higher the work function value of the first electrode 21 is. The lower the value of the oxygen gas partial pressure is, i.e., the higher the work function value of the first electrode 21 is, the lower the work function value of the first electrode 21 is. As the sputtering apparatus, a parallel flat plate sputtering apparatus or a DC magnetron sputtering apparatus is used. As the process gas, an argon (Ar) gas is used. As the target, an InGaZnO4 sintered body is used.

In this way, in the electronic device according to the first embodiment, the oxygen gas introduction amount (the oxygen gas partial pressure) is controlled when the first electrode 21 is formed by a sputtering method to control the work function value of the first electrode 21. The oxygen content rate of the first electrode 21 is less than the oxygen content rate of the stoichiometric composition.

Figure 2B:
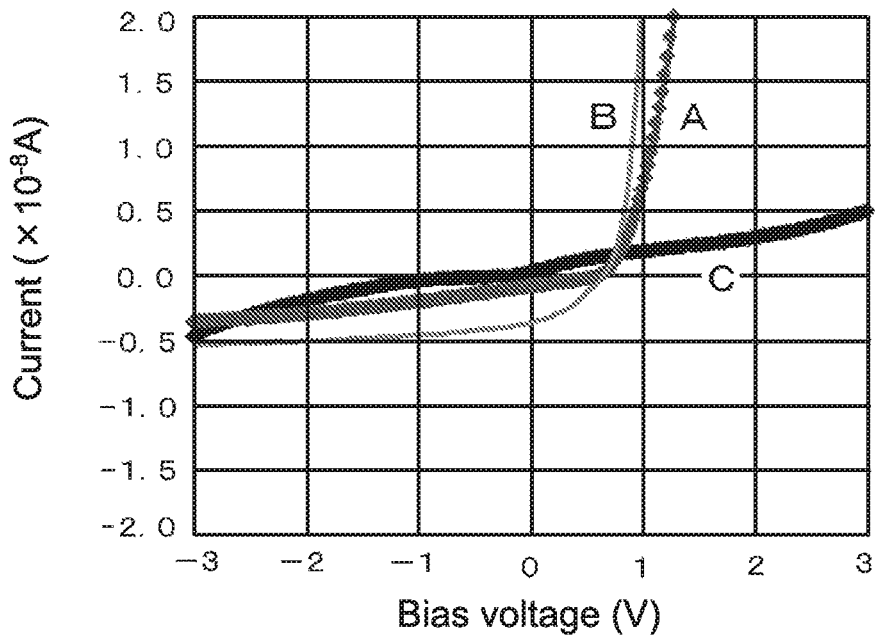
FIG. 2B is a graph showing an I-V curve of electronic devices according to the first embodiment, a second embodiment and a first comparative embodiment.

FIG. 2B is a graph showing an I-V curve of the electronic devices (the photoelectric conversion elements) according to the first embodiment and the first comparative embodiment. In FIG. 2B, "A" represents a measured result of the electronic device according to the first embodiment, "B" represents a measured results of the electronic device according to the second embodiment as described below and "C" represents a measure result of the electronic device according to the first comparative embodiment. The electronic device according to the first comparative embodiment is similar to that according to the first embodiment except that the first electrode 21 is composed of ITO instead of IGZO. FIG. 2B reveals that in the electronic device according to the first embodiment or the second embodiment described below, a current value is steeply increased at a reverse bias voltage of little less than 1 volt (at a bias voltage of little less than −1 volt). Table 1 shows values of internal quantum efficiency and values of on/off ratios of the electronic devices according to the first embodiment and the first comparative embodiment. The internal quantum efficiency 11 is a ratio of incident photon numbers to generated electron numbers, and can be represented by the following equation.

$$\eta = \{(h \cdot c)/(q \cdot \lambda)\}(I/P) = (1.24/\lambda)(I/P)$$

where
h: Planck's constant
c: light speed
q: electron charge
λ: wavelength (μm) of incident light
I: light current; a current value (ampere/cm2) at the reverse bias voltage of 1 volt measured in the first embodiment
P: power of incident light (ampere/cm2)

TABLE 1

|  | Internal quantum efficiency (%) | On/off ratio |
|---|---|---|
| First Embodiment | 39 | 2.6 |
| Second Embodiment | 55 | 3.4 |
| First Comparative Embodiment | 5.4 | 1.4 |

Figure 3A:
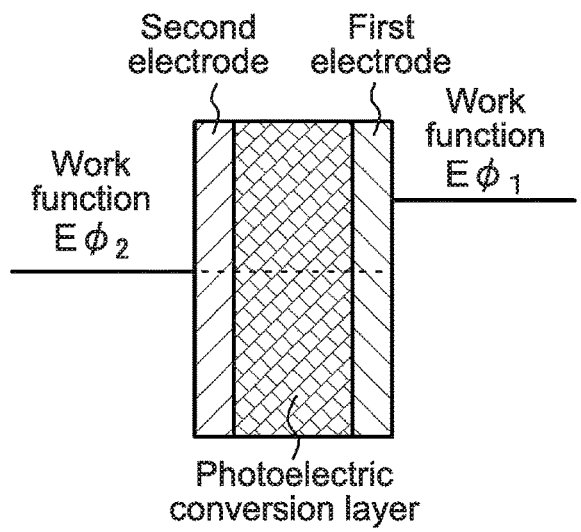
FIGS. 3A and 3B are conceptual views of energy diagrams of electronic devices according to the first embodiment and the first comparative embodiment, respectively.
Figure 3B:
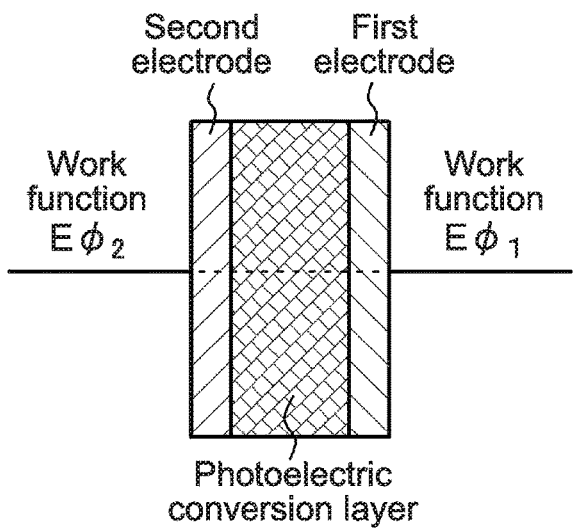
Figure 3C:
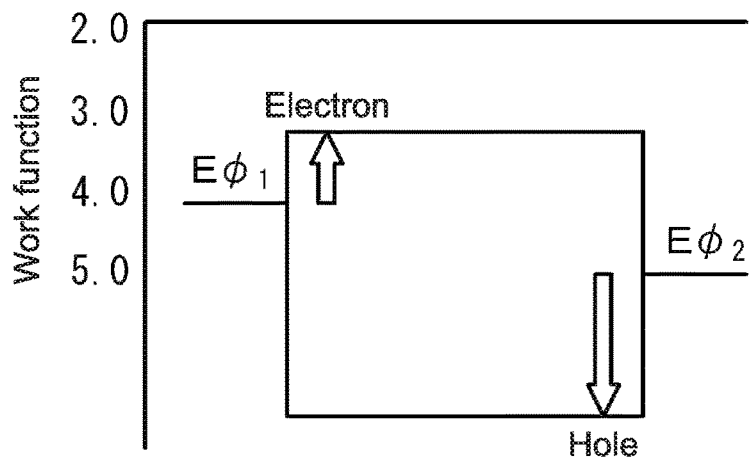
FIGS. 3C and 3D are conceptual views showing correlations of the differences between work function values and energy diagrams of electronic devices according to the first embodiment and the first comparative embodiment, respectively
Figure 3D:
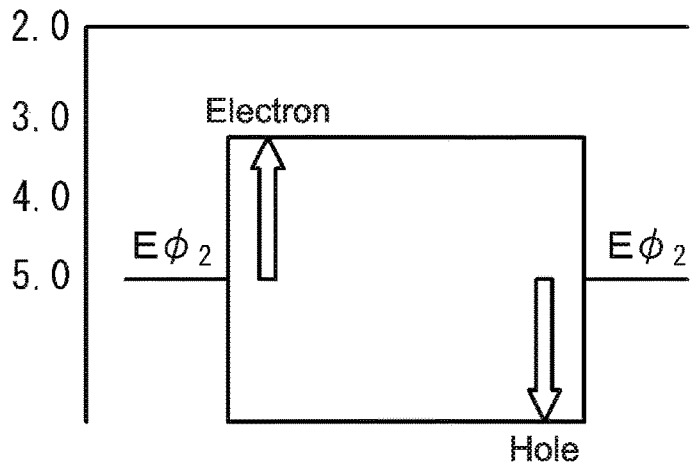

In the electronic device according to the first comparative embodiment where both of the first and second electrodes are composed of ITO, there is no difference between the work function value of the second electrode and the work function value of the first electrode as shown in a conceptual view of an energy diagram in FIG. 3B. Therefore, the holes are easily flowed from the second electrode to the first electrode, which results in an increased dark current. In addition, as there is no difference between the work function value of the second electrode and the work function value of the first electrode, no potential gradient is present (in other words, no internal electric field is generated in the photoelectric conversion layer) when the electrons and the holes are taken out, which makes difficult to take out the electrons and the holes smoothly (see a conceptual view in FIG. 3D). On the other hand, in the electronic device according to the first embodiment where the first electrode is composed of IGZO and second electrode is composed of ITO, a difference between the work function value of the second electrode and the work function value of the first electrode is 0.4 eV or more. FIG. 3A shows a conceptual view of an energy diagram. Therefore, the holes are prevented from flowing from the second electrode to the first electrode, which results in a prevention of a dark current. In addition, as there is a difference between the work function value of the second electrode and the work function value of the first electrode of 0.4 eV or more, a potential gradient is generated (in other words, an internal electric field is generated in the photoelectric conversion layer) when the electrons and the holes are taken out. By utilizing the potential gradient, the electrons and the holes can be taken out smoothly (see a conceptual view in FIG. 3C).

Figure 4A:
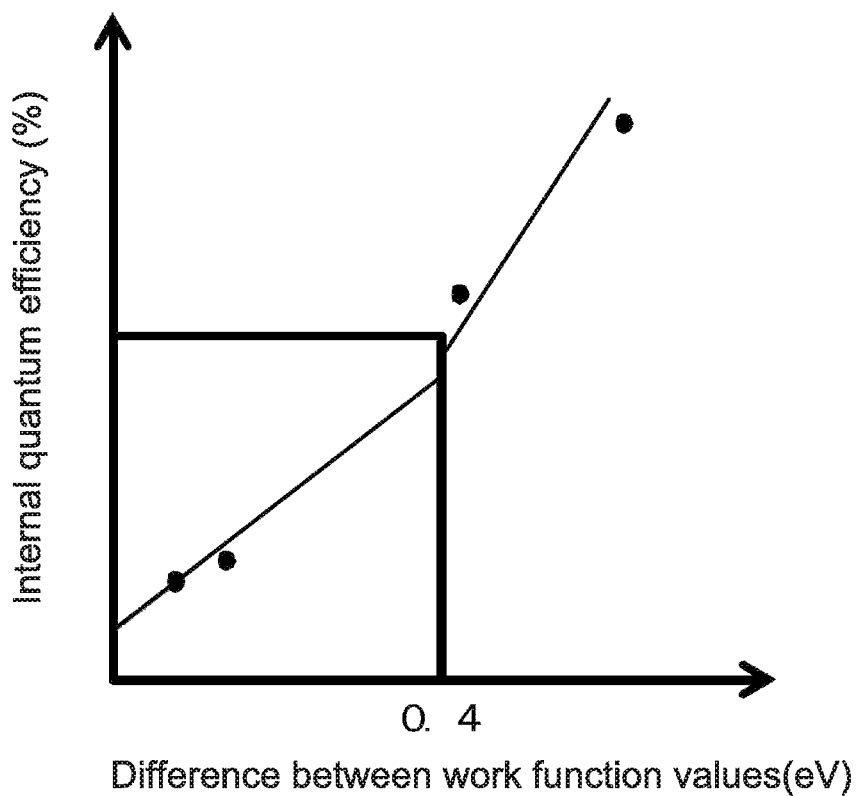
FIG. 4A is a graph showing a correlation of a difference between an internal quantum efficiency and a work function value of an electronic device according to a first embodiment.
Figure 4B:
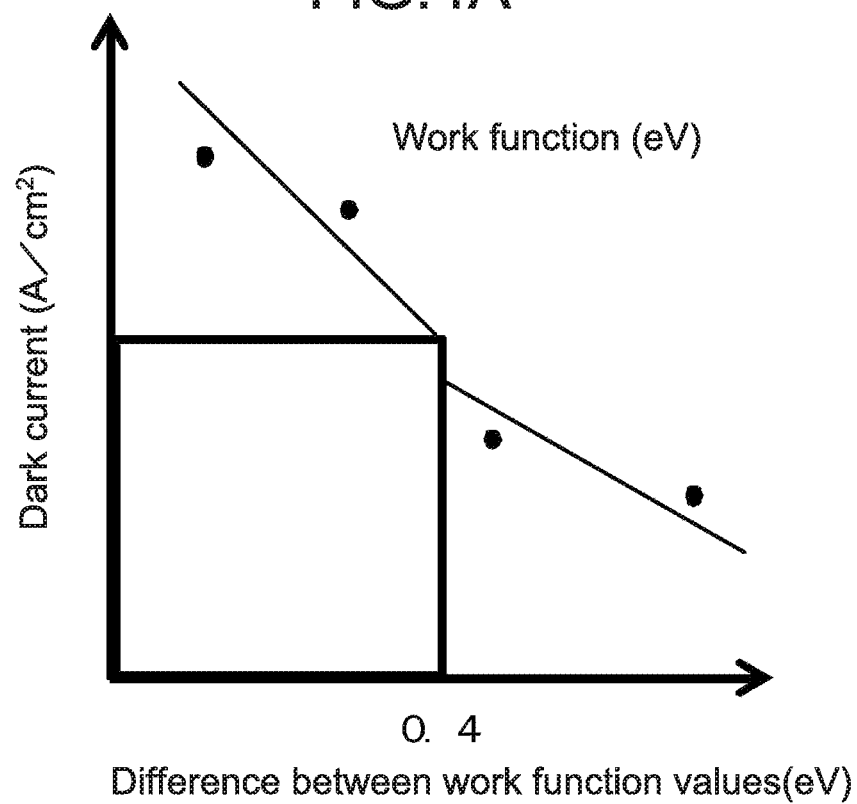
FIG. 4B is a graph showing a correlation of a difference between a dark current and a work function value of an electronic device according to a first embodiment.

In addition, FIG. 4A is a graph showing a correlation of a difference between the internal quantum efficiency and the work function value. FIG. 4B is a graph showing a correlation of a difference between the dark current (the current value provided when no light is irradiated at the reverse bias voltage of 1 volt measured in the first embodiment) and the work function value. A horizontal axis in each of FIGS. 4A and 4B represents the difference between the work function value of the second electrode 22 and the work function value of the first electrode 21. A horizontal axis in each of FIGS. 5A and 5B as described below represents the difference between the work function value of a first B layer 21B of the first electrode 21 and the work function value of a first A layer 21A of the first electrode 21. FIGS. 4A and 4B reveal that the internal quantum efficiency is obviously increased and the dark current is obviously decreased at around 0.4 eV of the difference between the work function values.

As described above, as the difference between the work function value of the second electrode and the difference between the work function value of the first electrode in the electronic device according to the first embodiment is specified, a large internal electric field can be generated in the photoelectric conversion layer based on the difference between the work function values, when the bias voltage (specifically, the reverse bias voltage) is applied between the first electrode and the second electrode. As a result, the internal quantum efficiency can be improved, i.e., the photocurrent can be increased. In addition, the dark current can be suppressed. In the method of producing an electrode for the electronic device according to the first embodiment, the oxygen gas introduction amount (the oxygen gas partial pressure) is controlled when the first electrode is formed by a sputtering method to control the work function value of the first electrode. As a result, a large internal electric field can be generated in the photoelectric conversion layer based on the difference between the work function values, thereby improving the internal quantum efficiency, i.e., the photocurrent can be increased. In addition, an electronic device being capable of suppressing a dark current can be generated simply.

Second Embodiment

Figure 1C:
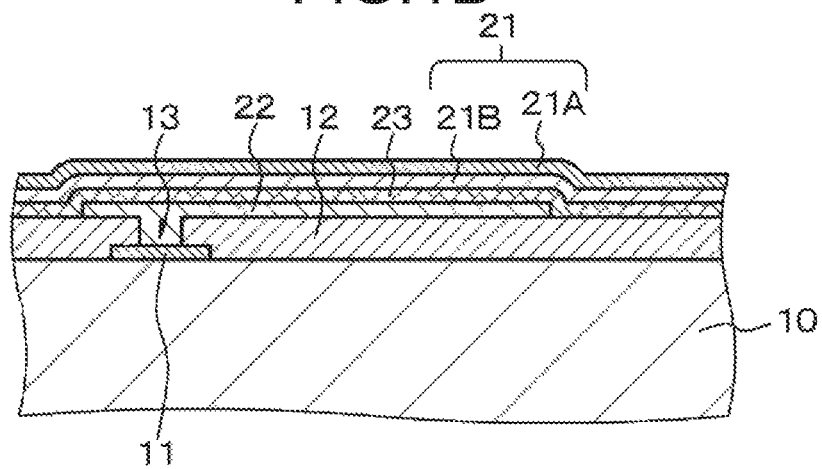
FIG. 1C is a schematic partial sectional view of an electronic device according to a second embodiment.

The second embodiment refers to an electronic device and a method of producing an electrode for the electronic device according to a second embodiment of the present disclosure. FIG. 1C is a schematic partial sectional view of the electronic device according to the second embodiment.

Figure 5A:
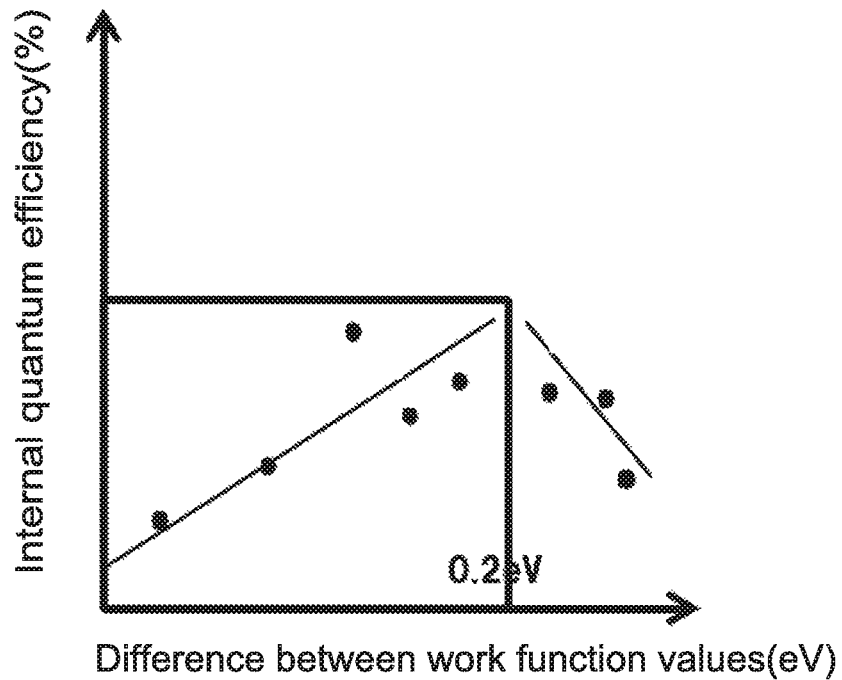
FIG. 5A is a graph showing a correlation of a difference between an internal quantum efficiency and a work function value of an electronic device according to a second embodiment.
Figure 5B:
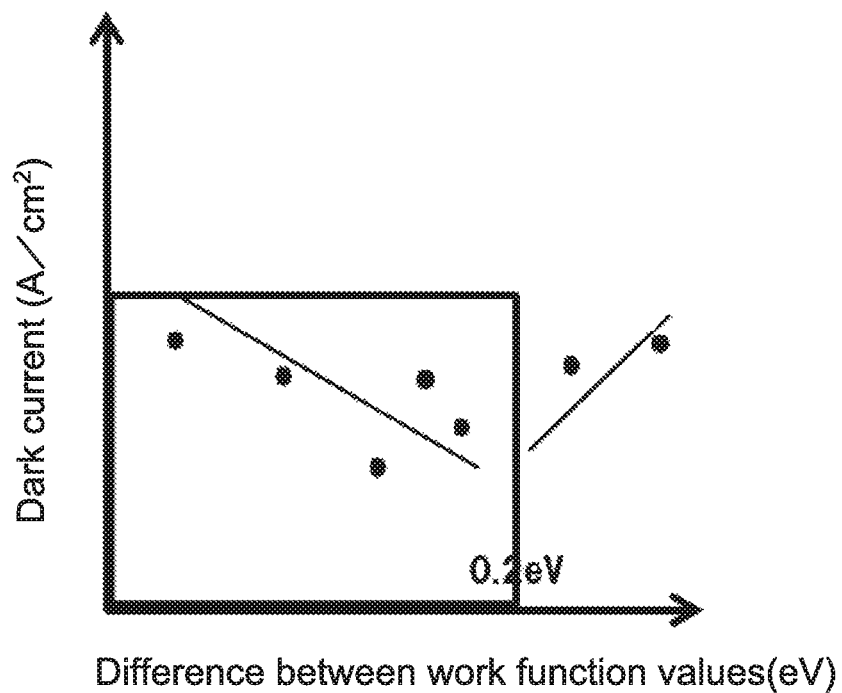
FIG. 5B is a graph showing a correlation of a difference between a dark current and a work function value of an electronic device according to a second embodiment.

In the electronic device according to the second embodiment, the first electrode 21 has a laminated structure including the first B layer 21B and the first A layer 21A from the photoelectric conversion layer side. A work function value of the first A layer 21A of the first electrode 21 is lower than a work function of the first B layer 21B of the first electrode 21. Specifically, a difference between the work function value of the first A layer 21A of the first electrode 21 and the work function of the first B layer 21B of the first electrode 21 is 0.1 eV to 0.2 eV, more specifically, 0.15 eV. A difference between the work function value of the second electrode 22 and the work function of the first A layer 21A of the first electrode 21 is 0.4 eV or more. The first electrode 21 has a thickness of $1 \times 10-8$ m to $1 \times 10-7$ m, specifically 50 nm. A ratio between the thickness of the first A layer 21A of the first electrode 21 and the thickness of the first B layer 21B of the first electrode 21 is 9/1 to 1/9, specifically 9/1. Also, according to the second embodiment of the present disclosure, a difference between the work function value of the second electrode 22 and the work function value of the first A layer 21A of the first electrode 21 is set to 0.4 eV or more, thereby, based on the difference between the work function values, generating an internal electric field in the photoelectric conversion layer to improve an internal quantum efficiency. When the composition of the first A layer 21A is [Ina(Ga, Al)bZncOd] and the composition of the first B layer 21$b$ is [Ina'(Ga, Al)b'Znc'Od'], a=a', b=b', c=c' and d<d'. Table 1 shows values of internal quantum efficiency and values of on/off ratios of the electronic devices according to the second embodiment. FIG. 2B shows an I-V curve of the electronic device (the photoelectric conversion element) according to the second embodiment. FIG. 5A is a graph showing a correlation of a difference between the internal quantum efficiency and the work function value. FIG. 5B is a graph showing a correlation of a difference between a dark current (the current value provided when no light is irradiated at the reverse bias voltage of 1 volt measured also in the second embodiment) and the work function value. FIGS. 5A and 5B reveal that the internal quantum efficiency is obviously increased and the dark current is obviously decreased as the difference between the work function value of the first A layer of the first electrode and the work function value of the first B layer of the first electrode is increased to around 0.2 eV.

In the method of producing the electrode for the electronic device according to the second embodiment, the oxygen gas introduction amount is controlled when the first electrode is formed by a sputtering method in a process similar to [Process-110] in the first embodiment, thereby controlling the work function values of the first A layer 21A and the first B layer 21B of the first electrode 2, as shown in the graph in FIG. 2A.

In the electronic device according to the second embodiment, the first electrode has the first A layer and the first B layer, and the difference between the work function values of the first A layer and the first B layer is specified. Therefore, the work function of the first electrode can be optimized, thereby exchanging (migrating) carriers more easily.

Third Embodiment

The third embodiment refers to a solid state imaging apparatus according to an embodiment of the present disclosure. The solid state imaging apparatus according to the third embodiment include the electronic device (specifically, the photoelectric conversion element) according to the first embodiment or second embodiment.

Figure 6:
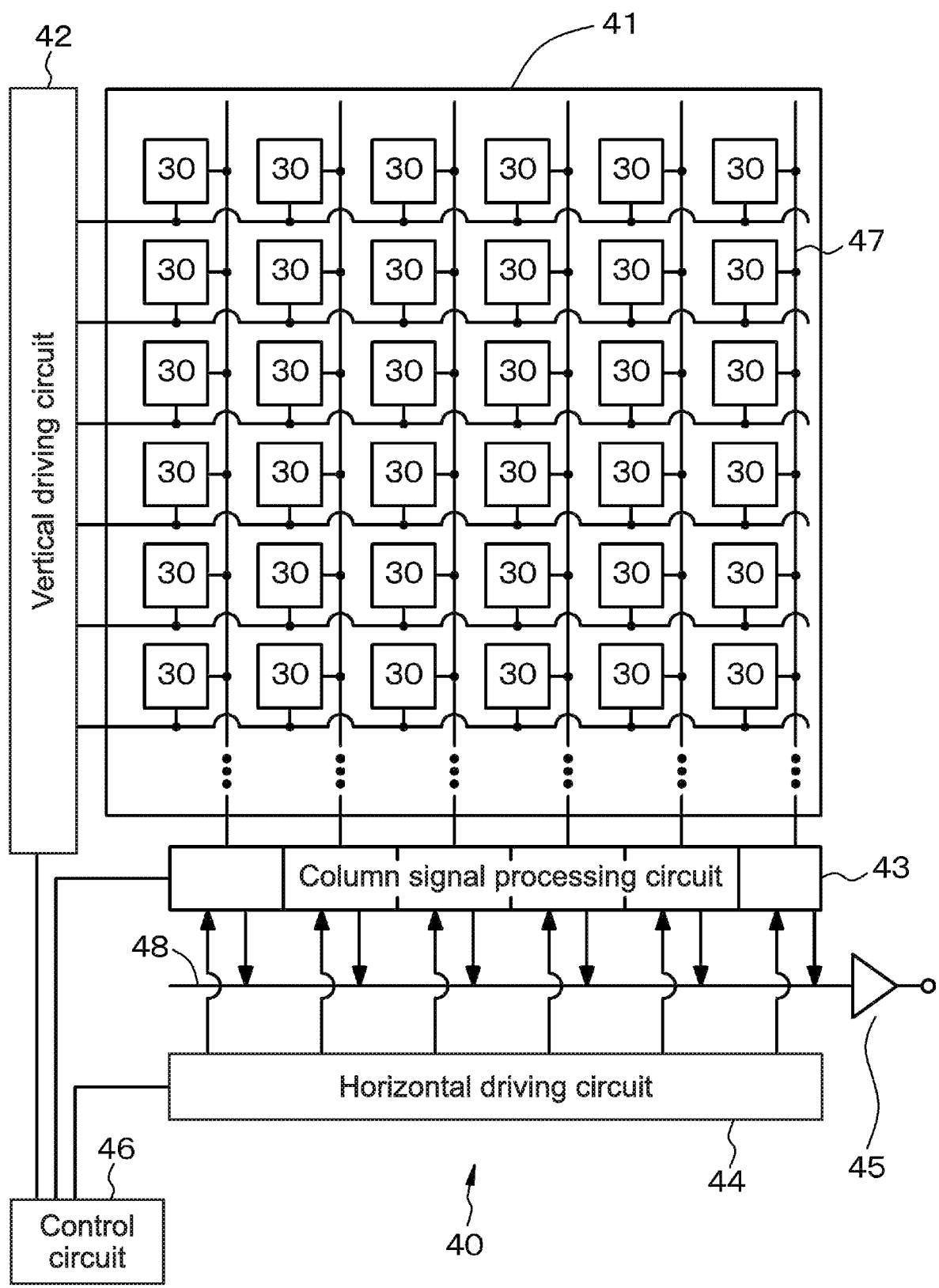
FIG. 6 is a conceptual view of a solid state imaging apparatus according to a third embodiment.

FIG. 6 is a conceptual view of the solid state imaging apparatus (the solid state imaging element) according to the third embodiment. A solid state imaging apparatus 40 according to the third embodiment is composed of an imaging area 41 where the electronic devices (the photoelectric conversion elements) 30 described in the first embodiment or the second embodiment are arranged in a two dimensional array on the semiconductor substrate (for example, the silicon semiconductor substrate), a vertical driving circuit 42, column signal processing circuits 43, a horizontal driving circuit 44, an output circuit 45 and a control circuit 46, etc. all of which are peripheral circuits. These circuits can be configured of well-known circuits. It will be appreciated that other circuit configurations (for example, a variety of circuits used in a CCD imaging apparatus and a CMOS imaging apparatus in the related art) can be used.

The control circuit 46 generates clock signals and control signals for operating the vertical driving circuit 42, the column signal processing circuits 43 and the horizontal driving circuit 44 based on vertical synchronizing signals, horizontal synchronizing signals and a master clock. The clock signals and the control signals generated are inputted to the vertical driving circuit 42, the column signal processing circuits 43 and the horizontal driving circuit 44.

The vertical driving circuit 42 is composed of shift resistors, for example, and selects and scans sequentially the respective electronic devices 30 in the imaging area 41 per row in a vertical direction. Pixel signals based on a current (signals) generated depending on the amount of light received in the respective electronic devices 30 are sent to the column signal processing circuits 43 via vertical signal lines 47.

The column signal processing circuits 43 are arranged per column of the electronic devices 30, for example, and perform signal processings such as noise removal and signal amplification of signals outputted from the electronic devices 30 in a row by signals from black reference pixels (not shown, formed around effective pixel regions) per electronic device. Horizontal selection switches (not shown) are disposed and connected between the output stages of the column signal processing circuits 43 and a horizontal signal line 48.

The horizontal driving circuit 44 is configured of shift resistors, for example, and sequentially outputs a horizontal scan pulse to sequentially select the respective column signal processing circuits 43 and to output signals from the respective column signal processing circuits 43 to the horizontal signal line 48.

The output circuit 45 performs signal processing to the signals sequentially supplied from the respective column signal processing circuits 43 via the horizontal signal line 48 and outputs them.

Although it depends on the materials of the photoelectric conversion layer, the photoelectric conversion layer itself can function as a color filter. Therefore, when no color filter is disposed, a color separation is possible. However, as the case may be, a well-known color filter that transmits a specific wavelength such as red, green, blue, cyan, magenta, yellow or the like may be disposed above the electronic devices 30 at a light incident side. The solid state imaging apparatus may be a surface irradiation type or a rear surface irradiation type. In addition, a shutter may be disposed in order to control light incident on the electronic devices 30, as necessary.

While the present disclosure is described herein with reference to illustrative embodiments, it should be understood that the present disclosure is not limited thereto. The structure, the configuration, the production conditions, the production method, and the materials used for the electronic devices (the photoelectric conversion element) and the solid state imaging apparatus described in Embodiment are illustrative and can be changed as necessary. When the electronic device according to the embodiment of the present disclosure is used as a solar cell, the photoelectric conversion layer may be irradiated with light while no voltage is applied between the first electrode and the second electrode. The electronic device according to the embodiment of the present disclosure can be used for an optical sensor and an image sensor as well as the imaging apparatus (the solid state imaging apparatus) such as a television camera.

The present disclosure may have the following configurations.

[A01] Electronic Device: First Embodiment

An electronic device, including:
a first electrode, a second electrode and a photoelectric conversion layer sandwiched between the first electrode and the second electrode,
the first electrode including an amorphous oxide composed of at least a quaternary compound of indium, gallium and/or aluminum, zinc and oxygen, and
a difference between a work function value of the second electrode and a work function value of the first electrode being 0.4 eV or more.

[A02] The electronic device according to [A01] above, in which
a difference between a work function value of the second electrode and a work function value of the first electrode is set to 0.4 eV or more, and
based on the difference between the work function values, an internal electric field is generated in the photoelectric conversion layer to improve an internal quantum efficiency.

[B01] Electronic Device: Second Embodiment

An electronic device, including:
a first electrode, a second electrode and a photoelectric conversion layer sandwiched between the first electrode and the second electrode,
the first electrode including an amorphous oxide composed of at least a quaternary compound of indium, gallium and/or aluminum, zinc and oxygen,
the first electrode having a laminated structure including a first B layer and a first A layer from a photoelectric conversion layer side, and
a work function value of the first A layer of the first electrode being lower than a work function of the first B layer of the first electrode.

[B02] The electronic device according to [B01] above, in which a difference between the work function value of the first A layer 21A of the first electrode 21 and the work function of the first B layer 21B of the first electrode 21 is 0.1 eV to 0.2 eV.

[B03] The electronic device according to [B01] or [B02] above, in which
a difference between a work function value of the second electrode and a work function value of the first A layer of the first electrode is 0.4 eV or more.

[B04] The electronic device according to any one of [B01] to [B03] above, in which
the first electrode has a thickness of $1 \times 10^{-8}$ m to $1 \times 10^{-7}$ m, and
a ratio between the thickness of the first A layer of the first electrode and the thickness of the first B layer of the first electrode is 9/1 to 1/9.

[B05] The electronic device according to any one of [B01] to [B04] above, in which
a difference between a work function value of the second electrode and a work function value of the first electrode is set to 0.4 eV or more, and
based on the difference between the work function values, an internal electric field is generated in the photoelectric conversion layer to improve an internal quantum efficiency.

[C01] The electronic device according to any one of [A01] to [B05] above, in which the work function value of the first electrode is 4.1 eV to 4.5 eV.

[C02] The electronic device according to any one of [A01] to [C01] above, in which
the first electrode is composed of indium gallium complex oxide, indium-doped gallium zinc complex oxide, aluminum oxide-doped zinc oxide indium zinc complex oxide or gallium-doped zinc oxide.

[C03] The electronic device according to any one of [A01] to [c02] above, in which
the second electrode is composed of indium tin complex oxide, indium zinc complex oxide or tin oxide.

[C04] The electronic device according to any one of [A01] to [C03] above, in which
the first electrode has light transmittance of 80% or more at wavelengths of 400 nm to 660 nm.

[C05] The electronic device according to any one of [A01] to [C04] above, in which the first electrode has a sheet resistance value of $3 \times 10 \Omega$/square to $1 \times 10^3 \Omega$/square.

[C06] The electronic device according to any one of [A01] to [C05] above, in which an oxygen gas introduction amount is controlled when the first electrode is formed by a sputtering method to control the work function value of the first electrode.

[C07] The electronic device according to any one of [A01] to [C06] above, in which an oxygen content rate of the first electrode is less than an oxygen content rate of a stoichiometric composition.

[C08] The electronic device according to any one of [A01] to [C07] above, which is a photoelectric conversion element.

[D01] A solid state imaging apparatus including the electronic device according to any one of [A01] to [C08] above.

[E01] Method of Producing Electrode for Electronic Device: First Embodiment

A method of producing an electrode for an electronic device including a first electrode, a second electrode and a photoelectric conversion layer sandwiched between the first electrode and the second electrode, the first electrode including an amorphous oxide composed of at least a quaternary compound of indium, gallium and/or aluminum, zinc and oxygen, a difference between a work function value of the second electrode and a work function value of the first electrode being 0.4 eV or more, an oxygen gas introduction amount being controlled when the first electrode is formed by a sputtering method to control the work function value of the first electrode.

[E02] The method of producing an electrode for the electronic device according to [E01], in which a difference between a work function value of the second electrode and a work function value of the first electrode is set to 0.4 eV or more, and based on the difference between the work function values, an internal electric field is generated in the photoelectric conversion layer to improve an internal quantum efficiency.

[E03] Method of Producing Electrode for Electronic Device: Second Embodiment

A method of producing an electrode for an electronic device including a first electrode, a second electrode and a photoelectric conversion layer sandwiched between the first electrode and the second electrode, the first electrode including an amorphous oxide composed of at least a quaternary compound of indium, gallium and/or aluminum, zinc and oxygen, the first electrode having a laminated structure including a first B layer and a first A layer from a photoelectric conversion layer side, a work function value of the first A layer of the first electrode being lower than a work function of the first B layer of the first electrode, and an oxygen gas introduction amount being controlled when the first electrode is formed by a sputtering method to control the work function value of the first electrode.

[E04] The method of producing an electrode for the electronic device according to [E03] in which, a difference between a work function value of the second electrode and a work function value of the first A layer of the first electrode is 0.4 eV or more.

[E05] The method of producing an electrode for the electronic device according to [E03] or [E04] in which, the first electrode has a thickness of $1 \times 10^{-8}$ m to $1 \times 10^{-7}$ m, and a ratio between the thickness of the first A layer of the first electrode and the thickness of the first B layer of the first electrode is 9/1 to 1/9.

[E06] The method of producing an electrode for the electronic device according to any one of [E03] to [E05 in which, a difference between a work function value of the second electrode and a work function value of the first electrode is set to 0.4 eV or more, and based on the difference between the work function values, an internal electric field is generated in the photoelectric conversion layer to improve an internal quantum efficiency.

[E07] The method of producing an electrode for the electronic device according to any one of [E01] to [E06], in which an oxygen content rate of the first electrode is less than an oxygen content rate of a stoichiometric composition.

[E08] The method of producing an electrode for the electronic device according to any one of [E01] to [E07] in which, the work function value of the first electrode is 4.1 eV to 4.5 eV.

[E09] The method of producing an electrode for the electronic device according to any one of [E01] to [E07] in which, the first electrode is composed of indium gallium complex oxide, indium-doped gallium zinc complex oxide, aluminum oxide-doped zinc oxide indium zinc complex oxide or gallium-doped zinc oxide.

[E10] The method of producing an electrode for the electronic device according to any one of [E01] to [E09] in which, the second electrode is composed of indium tin complex oxide, indium zinc complex oxide or tin oxide.

[E11] The method of producing an electrode for the electronic device according to any one of [E01] to [E10] in which, the first electrode has light transmittance of 80% or more at wavelengths of 400 nm to 660 nm.

[E12] The method of producing an electrode for the electronic device according to any one of [E01] to [E11] in which, the first electrode has a sheet resistance value of $3 \times 10 \Omega$/square to $1 \times 103 \Omega$/square.

[E13] The method of producing an electrode for the electronic device according to any one of [E01] to [E12] which is a photoelectric conversion element.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An imaging device, comprising:
a semiconductor substrate;
a first electrode disposed above the semiconductor substrate;
a second electrode disposed above the semiconductor substrate; and a photoelectric conversion layer disposed between the first electrode and the second electrode, wherein the second electrode is provided between the first electrode and the semiconductor substrate, wherein a difference between a work function value of the first electrode and a work function value of the second electrode is 0.4 eV or more, and wherein the first electrode includes an amorphous oxide conductor including at least a quaternary compound of indium, zinc, gallium and oxygen or a quaternary compound of indium, zinc, aluminum and oxygen, and wherein the amorphous oxide conductor has a sheet resistance value of $3\times10\Omega/\square$ $1\times10^3\Omega/\square$.

2. The imaging device according to claim 1, wherein the first electrode is transparent.

3. The imaging device according to claim 1, wherein the first electrode has light transmittance of 80% or more at wavelengths of 400 nm to 660 nm.

4. The imaging device according to claim 1, wherein the first electrode comprises one of indium gallium complex oxide, indium-doped gallium zinc complex oxide, aluminum oxide-doped zinc oxide, indium zinc complex oxide, and gallium-doped zinc oxide.

5. The imaging device according to claim 1, wherein the second electrode is transparent.

6. The imaging device according to claim 1, wherein the second electrode has light transmittance of 80% or more at wavelengths of 400 nm to 660 nm.

7. The imaging device according to claim 1, wherein the second electrode comprises one of indium tin complex oxide, indium zinc complex oxide, and tin oxide.

8. The imaging device according to claim 1, wherein the second electrode is coated with an inorganic insulation material.

9. The imaging device according to claim 1, wherein the second electrode is coated with a film, the film comprising one of silicon oxide, silicon nitride, and aluminum oxide.

10. The imaging device according to claim 1, wherein a work function value of the first electrode is less than a work function value of the second electrode.

11. The imaging device according to claim 1, wherein the first electrode has a thickness of $1\times10^{-8}$ m to $1\times10^{-7}$ m.

12. The imaging device according to claim 1, further comprising a layer between the first electrode and the photoelectric conversion layer, the layer comprising one of indium gallium complex oxide, indium-doped gallium zinc complex oxide, aluminum oxide-doped zinc oxide, indium zinc complex oxide, and gallium-doped zinc oxide.

13. The imaging device according to claim 12, wherein a ratio between a thickness of the first electrode and a thickness of the layer is 9/1 to 1/9.

14. An electronic apparatus comprising the imaging device according to claim 1.

* * * * *